United States Patent [19]

Hareyama

[11] 4,268,820
[45] May 19, 1981

[54] INTEGRATING TYPE ANALOG-TO-DIGITAL CONVERTER

[75] Inventor: Kyuichi Hareyama, Tokyo, Japan

[73] Assignee: Nippon Electric Co., Ltd., Tokyo, Japan

[21] Appl. No.: 941,353

[22] Filed: Sep. 11, 1978

[30] Foreign Application Priority Data

Sep. 9, 1977 [JP] Japan .................... 52-109368

[51] Int. Cl.³ .............................. H03K 13/02
[52] U.S. Cl. .................. 340/347 NT; 340/347 AD; 340/347 M; 324/99 D
[58] Field of Search .... 340/347 M, 347 NT, 347 AD; 324/99 D, 76 A, 78 D, 78 E, 78 N

[56] References Cited

U.S. PATENT DOCUMENTS 3,745,556 7/1973 Dorey ..................... 340/347 AD
4,164,733 8/1979 Landsburg et al. ........... 340/347NT

OTHER PUBLICATIONS

Landsburg, A Charge Balancing Monolithic A/D Converter, IEEE International Solid State Circuits Conference Digest of Technical Papers, Feb. 17, 1977.
Landsburg, A Charge-Balancing Monolithic A/D Converter, IEEE Journal of Solid State Circuits, vol. SC-12, No. 6, 12/1977, pp. 662-673.

Primary Examiner—Thomas J. Sloyan
Attorney, Agent, or Firm—Sughrue, Rothwell, Mion, Zinn and Macpeak

[57] ABSTRACT

An analog-to-digital converter of the integrating type is disclosed in which, while an analog input signal is integrated over a first period, a reference signal is selectively superposed on the analog input signal during the first period when the integrated value exceeds a predetermined value, so as to reduce the absolute value of the integrated value of the analog input signal, and then at the termination of the first period the integrated value is inversely integrated by a reference signal (a separate reference signal or the same reference signal as above-mentioned), a period within the first period during which the reference signal is superposed and the second period, i.e., from the beginning of the inverse integration after the first period to the time point that the integrated value reaches the predetermined value being used to produce an output in a digital form. Since the inverse integration is selectively performed in the first period, the absolute value of the integrated value is small at the termination of the first period. As a result, the second period is shortened and the output amplitude of the integrator is reduced.

16 Claims, 15 Drawing Figures

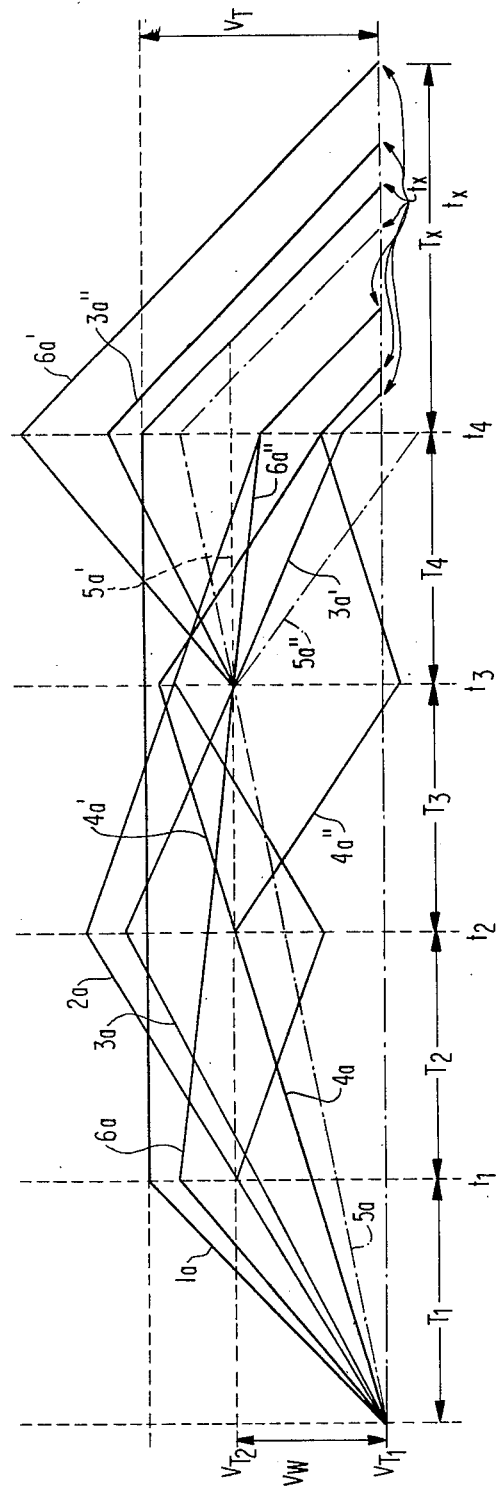
FIG 8
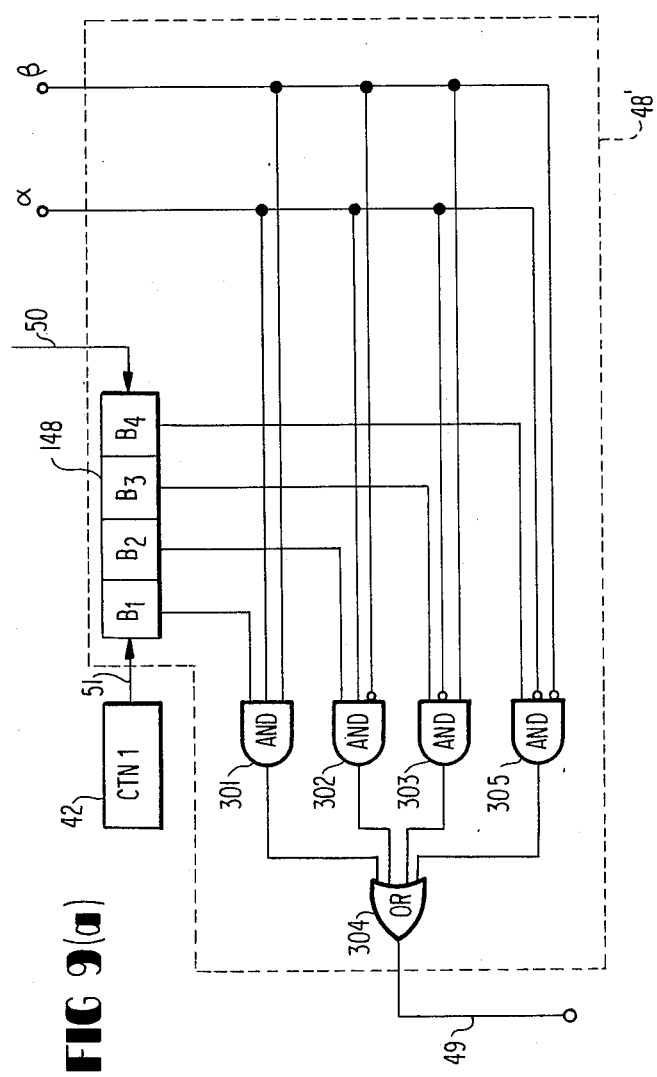
FIG 9(a)
FIG 9(b)
| α | β | RESOLUTION | K |
|---|---|---|---|
| 1 | 1 | I | 1 |
| 1 | 0 | $I + 2^0$ | 2 |
| 0 | 1 | $I + 2^1$ | 4 |
| 0 | 0 | $I + 2^2$ | 8 |

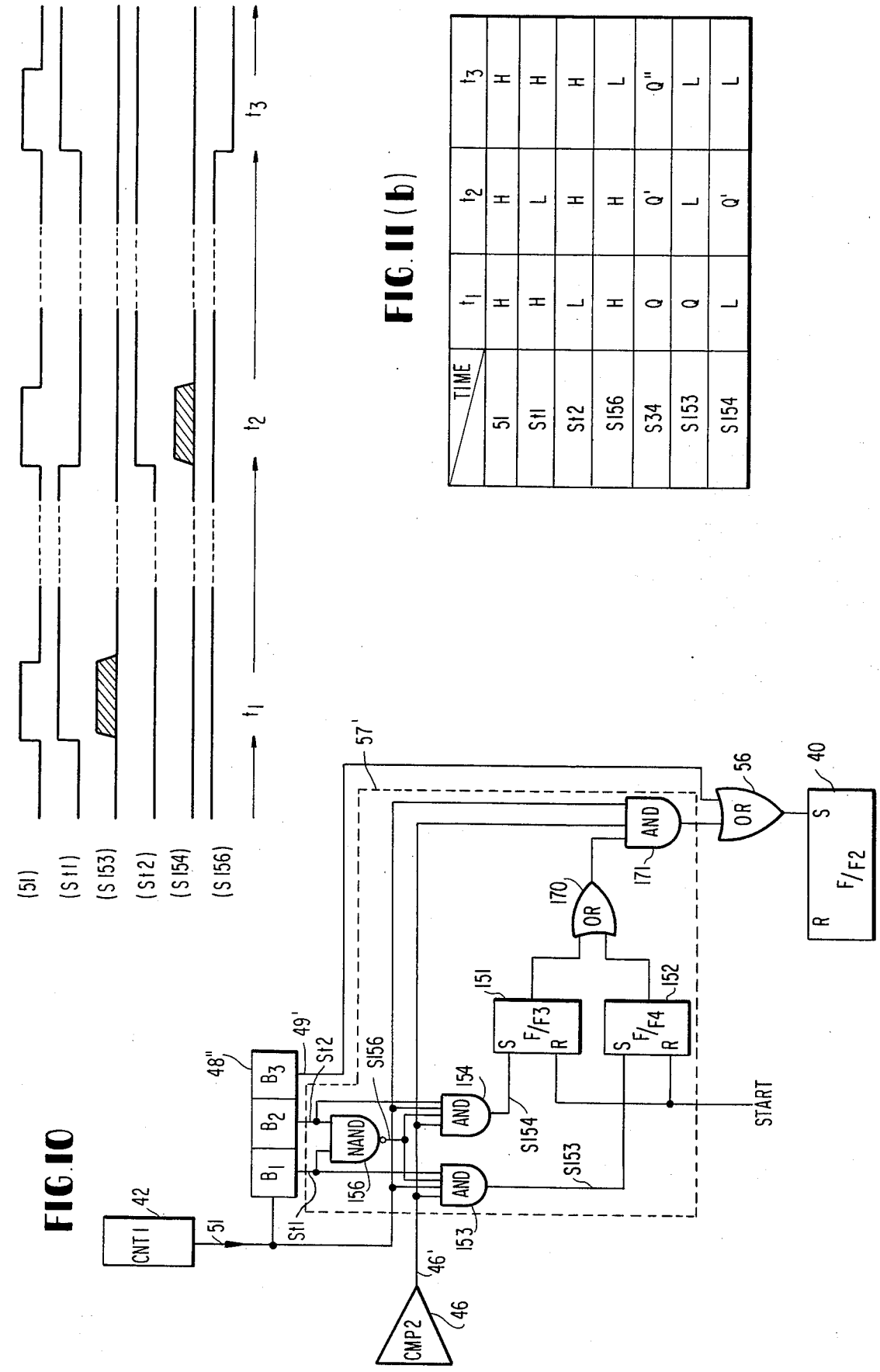

INTEGRATING TYPE ANALOG-TO-DIGITAL CONVERTER

BACKGROUND OF THE INVENTION

The present invention relates to an analog-to-digital converter and, more particularly, an analog-to-digital converter of the integrating type.

A conventional integrating analog-to-digital converter is described in U.S. Pat. No. 3,316,547 to Stephan K. Ammann. This converting system is known as the so-called dual slope integrating analog-to-digital converter. The system will be described with reference to FIGS. 1 and 2.

As shown in FIG. 1, the prior art converter comprises an integrator 1 composed of an input resistor R, an integrating capacitor C, a reset switch 11 and an operational amplifier 4. A voltage $-V_1$ of an analog signal source 2 or a reference voltage $V_2$ of a reference voltage source 3 is selectively applied to an input terminal 12 of the integrator 1, through operation of a switch 18. The output signal 14 is the integrator 1 and a threshold voltage $V_T$ are applied to a comparator 5 where the output signal 14 is compared with the threshold voltage $V_T$. The output 15 of the comparator 5 is applied to one of two input terminals of an AND gate 13 whose other input terminal receives a pulse signal from a pulse generator 6. The output 17 of the AND gate 13 is transmitted to a counter 7. A control circuit 8 controls on-off operation of the switch 11 through a flip-flop 9, resets the counter 7 to its initial state and controls the on-off operation of the switch 18 through a flip-flop 10.

For an explanation of the operation, reference is also made to FIG. 2 illustrating waveforms at respective points in the circuit shown in FIG. 1. At time $t_R$ the control circuit 8, produces a signal which in turn resets the flip-flops 9 and 10. A signal so produced at this time from the flip-flop 9 closes the switch 11 so that the integrator 1 is reset to be at zero level at the output. Also in response to a signal $S_1$ of the flip-flop 10, the switch 18 couples the analog signal source 2 with the input 12 of the integrator 1. Then, at time $t_0$ the reset state of the flip-flop 9 is released by a signal from the circuit 8 to open the switch 11. From this time $t_0$, the integrator 1 integrates the voltage $-V_1$ of the analog signal source 2 to be converted, and its integration output 14 is compared wih the threshold level $V_T$. When the integration output exceeds the threshold level $V_T$ at time $t_{11}$ the comparator 5 produces the output 15 which in turn enables the AND gate 13 to transmit the pulses from the pulse generator 6 to the counter 7. Thus the integrator 1 continues its integration, and thus the counter 7 also continues its counting operation. At time $t_2$ when the counter 7 reaches its full scale count, the counter 7 produces a full scale output 16' which in turn sets the flip-flop 10 to turn the switch 18 to the reference voltage source 3 by the signal S1, and at the same time the count of the counter 7 returns to zero. The period of time from the initiation ($t_1$) of counting by the counter 7 when the integration output 14 exceeds the reference value $V_T$ of the reach of the full scale count ($t_2$) is expressed by $T_1$. Upon the switching of the switch 18, the integrator 1 initiates the integration of the voltage $V_2$ of the reference voltage source 3. Since the polarity of the voltage $V_2$ is set to be opposite to that of the voltage $V_1$ of the analog signal source 2, the integrator 1 initiates an inverse integration from this time, that is to say, it initiates a subtraction from an absolute value of the integration value at time $t_2$. Thus, the output of the integrator 1 gradually decreases. At time $t_3$ the integration value returns to the reference value $V_T$ and the comparator output 15 stops. As a result, the gate 13 closes to inhibit transferring the pulses 17 to the counter 7, resulting in the interruption of the counting operation of the counter 7. The count output 16 of the counter 7 at this time represents the number of pulse counts N in the time interval $T_2$ from time instant $t_2$ to the time point $t_3$ that the output 14 of the integrator 1 reaches again the threshold voltage $V_T$ of the comparator 5. The voltage $-V_1$ of the analog signal source 2 is integrated over the period of time T1 so that the output 14 of the integrator 1 changes by $\Delta V$, and the difference $\Delta V$ between level $V_x$ at time $t_2$ and level $V_T$ is given as follows:

$$\Delta V = V_1 \times T_1/RC.$$

The pulse repetition frequency $f_0$ of the pulse generator 6, the full scale count F of the pulse counter durig the period T1 and the period T1 are related by $T_1 = F/f_0$. Upon substituting for $T_1$, the following equation is obtained:

$$\Delta V = V_1 \times F/RC f_0.$$

Similarly, the output change of the integrator 1 during the period T2 is $\Delta V$ and the number of pulse counts N during the period T2 has a relation of $T_2 = N/f_0$. Therefore, we have the following relation of the difference $\Delta V$:

$$\Delta V = V_2 \times T_2/RC = V_2 N/RC f_0.$$

Rearranging the equations $\Delta V = V_1 \times F/RC \; f_0$ and $\Delta V = V_2 \times N/RC \; f_0$, there is obtained the following equation (1): PS $$N = V_1/V_2 \times F \text{ or } T_2 = V_1/V_2 \times T_1. \tag{1}$$

Therefore, if $F/V_2$ is selected to be 10 n ($n = 0, 1, 2 \ldots$); the input analog voltage V1 may be expressed in digital form by the output count N from the counter 7.

Thus, the conventional integrating A/D converter requires a conversion time period of at least $T_1 + T_2$. The maximum value T2 max of the period T2 is determined by the maximum value V1 max. of the analog input voltage and is given by:

$$T_{2max} = (V_{1max}/V_2) \times T_1.$$

If $V_{1max} = V_2$ and $T_{2max} = T_1$, the converting time period s 2T1. The maximum value $\Delta V(max)$ of the amplitude of the output signal of the integrator is expressed as follows:

$$\Delta V(max) = (V_{1max} \; F)/(RC f_0) = (V_{1max})/(RC)T_1.$$

Thus, in order to improve the converting precision, $\Delta V(max)$ must be relatively large, and therefore the circuit components used in the integrator must have withstand high voltage.

SUMMARY OF THE INVENTION

Accordingly, it is an object of the invention to provide an integrating analog-to-digital converter in which the converting time period is short and the amplitude of an integrating output is small.

It is another object of the invention to provide an integrating analog-to-digital converter composed of circuit components which withstand low voltage.

According to the invention, there is provided an analog-to-digital converter in which, while an analog input signal is integrated over a first period which is divided into multiple intervals, a reference signal is selectivwely superposed on the analog input signal during one or more intervals in the first period, when, at the end of the each multiple interval, integrated value exceeds a predetermined value, so as to reduce the absolute value of the integrated value of the analog input signal in the subsequent interval, and then at the termination of the first period the integrated value is inversely integrated by a reference signal (a separate reference signal or the same reference signal as above-mentioned), the one or more intervals within the first period during which the reference signal is superposed and the second period, i.e., from the beginning of the inverse integration after the first period to the time point that the integrated value reaches the predetermined value being used to produce an output in a digital form.

With such a scheme, the inverse integration is selectively performed in the first period and therefore the absolute value of the integrated value is small at the termination of the first period. As a result, this invention has advantageous effects that the second period is shortened and the output amplitude of the integrator is reduced.

The explanation to follow will frequently refer to a case where a reference signal is commonly used for the superposing reference signal and for the reverse integration reference signal. It should be expressively understood, however, that separate reference signals with different currents or voltages may be used. Additionally, either a voltage source or a current source may be used for the analog input signal and the reference signal. The reference signal is of the opposite polarity to the input signal but its absolute value may be smaller than, equal to or larger than the latter.

According to one embodiment of the analog-to-digital converter system according to the invention, following an arbitrary time point $t_0$, successive K time equals intervals ($T_1, T_2, \ldots T_1 \ldots T_k$) are established with time points ($t_1, \ldots t_i, \ldots t_k$) at which the corresponding time intervals terminate. From the time point $t_0$, integration of an analog input signal is started. At each time point $t_1, t_1, \ldots t_i$ when the respective time interval $T_1, T_2, \ldots, T_i$ terminates, the integral value at that time is compared with a predetermined value. As a result of the comparison, when the integral value is above the predetermined value, a second reference signal is superposed on the analog input signal so as to reduce the absolute value of the integral value, and the combined input and superposed reference signals are continuously integrated over the subsequent time interval ($T_2, T_3, \ldots T_{i+1}$) until the succeeding time point $t_2, t_3, \ldots t_{i+1}$. When the integral value at the time point of the termination of each time interval is below the predetermined value, only the analog input singal is continuously integrated over the succeeding time interval. In this manner, the integration is continued until time point $t_k$. From the time point $t_k$, only the first reference signal is integrated and this integration is continued until time point $t_x$ that the integral value returns to the initial value at the time point $t_0$. At this time $t_x$, the analog-to-digital converting operation is completed. The total sum of the time periods when the second reference signal is superposed during the integration period from time point $t_0$ to time point $t_k$ and the time period of the application of the first reference signal are used for providing a digital quantity corresponding to the analog input signal. As previously mentioned, the second reference signal used until time point $t_k$ and the first reference signal used after the time point $t_k$ are of opposite polarity with respect to the input signal and may have different values from each other. If different values are used, either the time period before or after the time point $t_k$ must be multiplied by a constant corresponding to the ratio between the values of the second and first reference signals.

According to another aspect of the invention, there is provided an analog-to-digital converter comprising means for setting a given number of successive fixed time intervals, an integrator, means for setting the output signal of the integrator at a given initial value before the initiation of integration, input means for selectively applying an analog input signal and a reference signal of opposite polarity to that of the input signal to the integrator, means for judging whether the output signal of the integrator is above or below a predetermined value at the time when each time interval terminates, means for controlling the input means in such manner that when the output of the integrator is judged to be above the predetermined value, the analog input signal and the reference signal are inputted into the integrator during the a succeeding fixed time interval, and when it is judged to be below the predetermined value, only the analog inut signal is applied to the integrator during the succeeding time interval, means for applying only the reference signal to the integrator after the given number of the fixed time intervals, means for detecting the time point that the output of the integrators returns to the initial value, and means for detecting the total time intervals during which the reference signal is applied, whereby the analog input signal is expressed by the total time intervals.

According to further aspect of the invention, there is provided an analog-to-digital converter comprising an integrator for selectively integrating an analog input current ($I_x$) and a reference current ($=I_R$) of the opposite polarity to that of the analog input current, means (reset means F/F1) for resetting the output level of the integrator to a bias potential ($V_{T1}$), means (switch S11) for selectively applying the analog input current ($I_x$) to the integrator, means (switch S12) for selectively applying the reference current ($-I_R$) to the integrator, means (second comparator CMP2) for comparing the output level of the integrator with a second bias potential $V_{T2}$, a first counter (CNT1) for counting N (N: positive integer) of clock pulses with a given pulse repetition rate $f_0$, to produce a full scale count pulse thereby setting up a fixed time interval Tc and for repeating the production of the full scale count pulse, a second counter (CNT2) for counting K (K: positive integer and $K \geq 2$) of the full count pulses of the first counter to produce a full scale count pulse, a third counter (CNT3) for counting the clock pulses only in a period of time during which the reference current $-I_R$ is applied to the integrator, and means (first comparator CMP1) for detecting the time point $t_x$ that the output level of the integrator returns to the first fixed bias potential ($V_{T1}$). After the output signal of the integrator is set at the first bias potential ($V_{T1}$) (at time $t_0$), only the first switch (S11) is closed so that the analog input current ($I_x$) is applied to the integrator. During the first fixed time interval $T_1$ that the first counter counts N clock pulses, the integrator integrates the analog input current (Ix). At the time point $t_1$ that the time interval $T_1$ terminates, the second comparator (CMP2) compares the output of the integrator with the second fixed bias potential ($V_{T2}$). When the integrator output reaches or exceeds the second bias potential ($V_{T2}$), the switch (S12) is closed and the reference current ($-I_R$), in addition to the analog input current (Ix), is applied to the input of the integrator. During the second fixed period $T_2$ that the first counter counts again N clock pulses, the integrator integrates the sum of the analog input current Ix and the reference current $-I_R$. On the other hand, when the integrator output fails to reach the second bias potential ($V_{T2}$), the switch (S12) is left open and the integrator continuously integrates only the analog input current Ix during the second fixed period $T_2$. During a period of time ($K \cdot Tc = T_1 + T_2 + \ldots + T_k$) till the second counter transmits a full scale count signal (at time $t_k$), at time points $t_1, t_2 \ldots, t_{k-1}$ that the first counter produces respective full scale count signals, the second comparator repeats a similar comparing operation. The switch (S12) repeats its open and close operation in accordance with the result of the comparison, and during the period K.Tc the analog input current (Ix) is continuously applied to the integrator. Thereafter, at time $t_k$ the switch (S11) opens and the application of the analog input current (Ix) to the integrator is stopped. Regardless of the relative amplitude of the integrator output to the second bias voltage ($V_{T2}$), the switch S12 closes and the integrator integrates only the reference current ($-I_R$). The time point $t_x$ that the integrator output reaches the first bias potential ($V_{T1}$) again is detected by the first comparator. During all the periods that the reference current ($-I_R$) is applied to the integrator during the periods from $T_1$ to $T_k$ and during the period $T_x$ from time $t_k$ to $t_x$, the third counter counts the clock pulses. The count of the third counter (CNT3) at time $t_x$ corresponds to a digital amount of the analog input current. The first and second bias potentials $V_{T1}$ and $V_{T2}$ are favorably selected as in the following:

$$|V_{T2} - V_{T1}| = (A/2) \cdot I_R / C \cdot TC,$$

where C is the integrating capacitance of the integrator and A is a constant larger than 1. The following relationship is more favorable for the constant A:

$$A > 2(k-1)/K.$$

In the above aspect, the third counter may be omitted if the first counter is made to operate only during the period Tx and a fourth counter is provided to count the number of the periods in that the reference current is applied during the periods KTc ($=T_1 + T_2 + \ldots + T_k$). In this case, the count of the fourth counter till time point $t_k$ and the count of the first counter during the period $T_x$ correspond to the digital output corresponding to the analog input current value. Furthermore, at the respective time points $t_{M-n}$ (n is positive integer) to $t_{M-1}$ after $t_0$, when the output of the integrator fails to reach the second bias voltage ($V_{T2}$), the integrator may be provided with means (latch circuit) for applying only the analog input current (Ix) thereto, irrespective of the result of the comparison by the second comparator at respective time points from $t_M$ to $t_k$. In this case, when K is an even number, M is preferably selected to be K/2, and when K is an odd number, preferably to be $M = (K-1)/2$ or $M = (K+1)/2$. Where the integrator output is always above the second bias potential $V_{T2\,L}$ at all the time points from time points $t_0$ to $t_M$ at which the counter produces full scale count pulses, it is preferable that the integrator is provided with means (latch circuit) for applying both of the analog input current (Ix) and the reference current ($-I_R$) thereto irrespective of the result of the comparison by the second comparator from time point $t_M$ to time point $t_k$.

Furthermore, a control circuit for controlling the number of full scale counts by the second counter may be used. In this case, the number of the K is appropriately set by the control signal to the control circuit so as to change the converting resolution case by case.

Other objects and features of the invention will be apparent from the following description taken in connection with the accompanying drawings.

BRIEF DESCRIPTION OF THE DRAWINGS

FIG. 8 shows a set of waveforms of an output signal of the integrator used in the converter in the case of K=4;

FIG. 9(a) shows a block schematic diagram of a part of second embodiment of the analog-to-digital converter according to the present invention;

FIG. 9(b) shows a table for illustrating the function of the converter;

FIG. 10 shows a block schematic diagram of a part of a third embodiment of the analog-to-digital converter according to the present invention;

FIGS. 11(a) and (b) shows a set of waveforms at the respective points in the third embodiment and a truth table of the circuit in FIG. 10, respectively;

DESCRIPTION OF THE PREFERRED EMBODIMENTS

At first, the concept of the invention will be given with reference to FIGS. 3 and 4.

Figure 3:
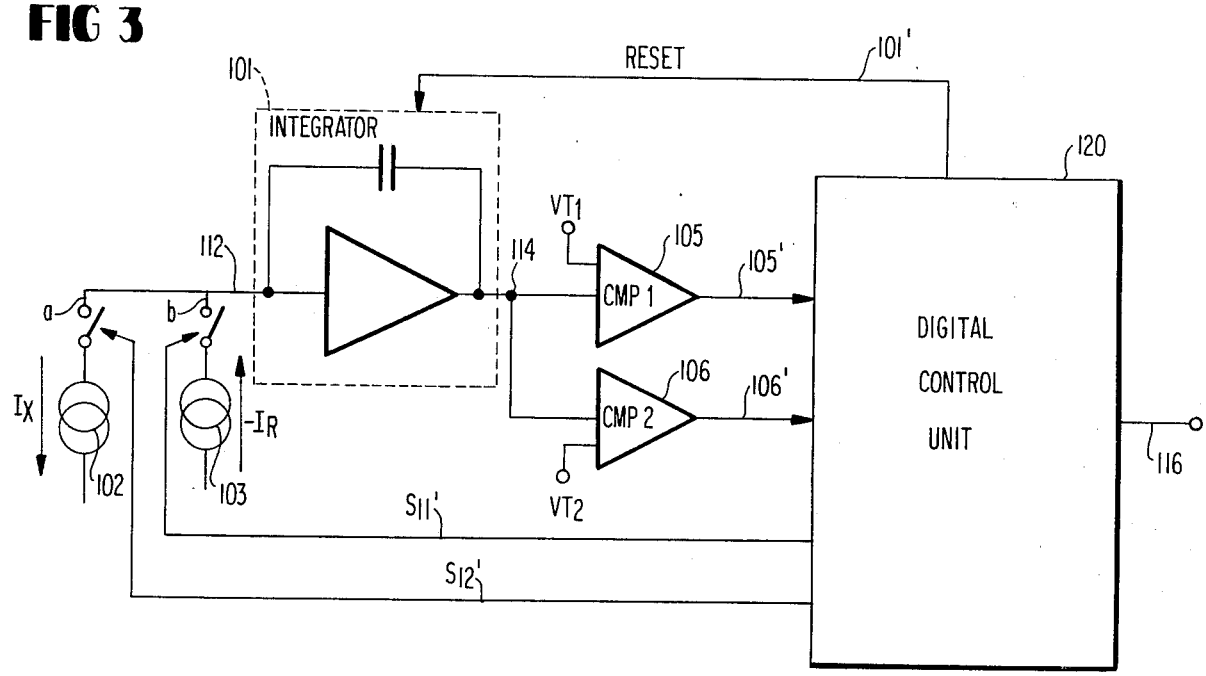
FIG. 3 shows a block diagram of a basic construction of an analog-to-digital converter according to the present invention.
Figure 4:
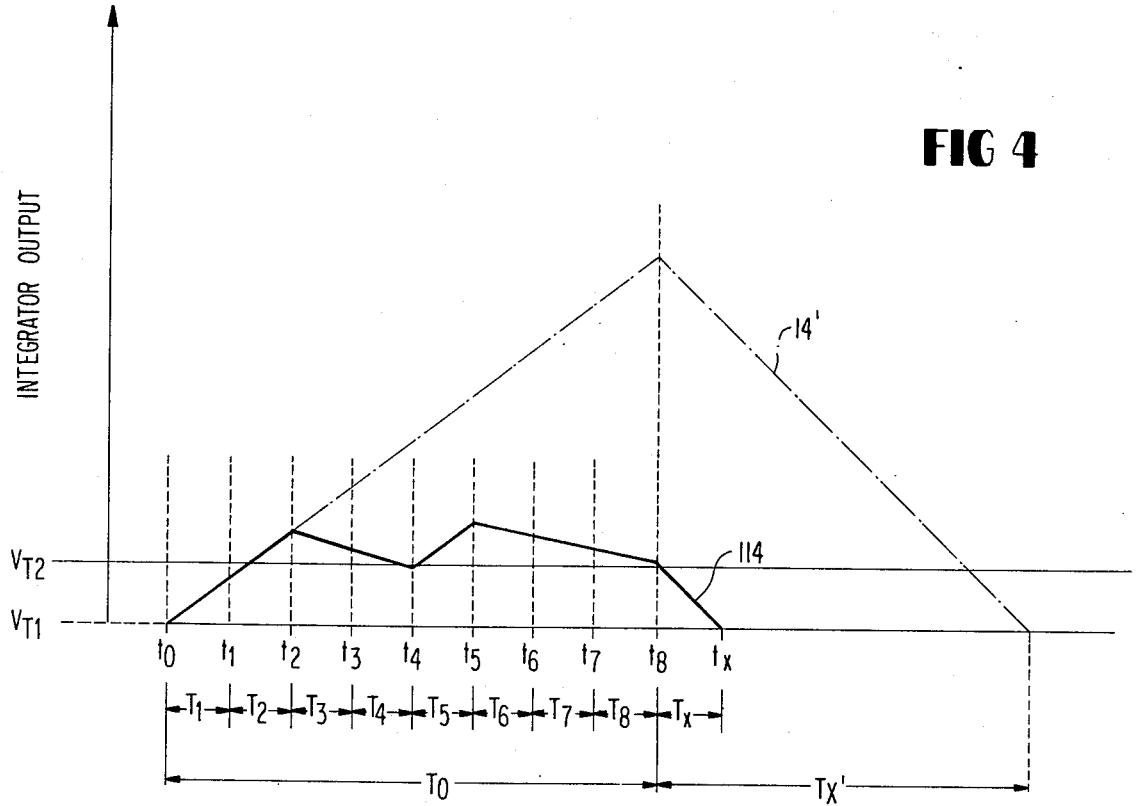
FIG. 4 shows a set of waveforms comparatively illustrating an output waveform of the integrator used in the analog-to-digital converter of the present invention and that of the conventional converter.

As shown in FIG. 3, an integrator 101 in the analog-to-digital converter (hereinafter referred to as an A-D converter) is coupled at the output 114 with a first comparator (CMP 1) 105 and a second comparator (CMP 2) 106. The first comparator 105 receives an initial value $V_{T1}$ as a reference signal, and the second comparator receives a given value $V_{T2}$ as a reference signal. The output signals 105' and 106' of the first and second comparators 105 and 106 are applied as control signals to a digital control unit 120. The digital control unit 120, produces a digital output 116. In response to the signals S11' or S12' from the digital control unit 120, an analog input current Ix 102 and a reference current $-I_R$ 103 (these currents may be replaced by corresponding voltages) are selectively applied respectively to input ports a and b coupled to the input 112 of the integrator 101. In the present invention, the integrator 101 can be coupled with the analog input current 102 and/or the reference current 103, unlike the conventional A/D converter in which the integrator is connected to either the analog input current 102 or the reference current 103.

The operation of the analog-to-digital converter thus constructed will be described with reference to FIG. 4.

At time $t_o$, the digital controller 120 issues a command signal 101' which sets the output of the integrator 101 at an initial value $V_{T1}$ and also issues a switch control signal S12' which couples the analog input current Ix 102 with the input of the integrator. Accordingly, the integrator 101 starts to integrate the analog input signal over the time interval $T_1$ from $t_0$ to $t_1$. At time $t_1$, the output 114 of the integrator 101 is compared with the reference voltage $V_{T2}$ by the second comparator 106. When the integrator output 114 exceeds the reference voltage $V_{T2}$, the comparator 106 produces an output signal 106'. The control unit 120 detects the comparator output 106' at time $t_1$, but at this time $t_1$ the integrator output 114 is below the voltage $V_{T2}$ and hence the comparator does not produce the output 106' and the control unit 120 also produces no switch control signal S11'. Therefore, the integrator 101 continues the integration of the analog input current Ix 102 during the period $T_2$ till the next time point $t_2$. At time $t_2$, the integrator output 114 exceeds the given value $V_{T2}$ so that the comparator 106 produces the output 106'. The digital control unit 120 detects the comparator output 106' to produce the switch control signal S11', thereby closing the switch b to superpose the reference current $-I_R$ 103 on the input current Ix 102. Accordingly, to the integrator input 112 are applied the analog input current Ix 102 and the reference current $-I_R$ 103 which is opposite in polarity and larger than the analog input current Ix in magnitude. Under this condition, the integrator 101 continues its integration over the period T3 from time point $t_2$ to time point $t_3$. During this period, the polarity of the input superposed currents to the integrator 101 is opposite to the output of the integrator so that the absolute value of the integrator output 114 gradually decreases. At time $t_3$, the integrator output 114 still exceeds the reference voltage $V_{T2}$ so that the integrator 101 continues the integration of the sum of the input currents Ix and the reference current $-I_R$ over the period T4 till the time point $t_4$. At time $t_4$, the output 114 of the integrator 101 falls below the reference value $V_{T2}$ so that the output 106' of the comparator 106 disappears and the digital control unit 120 permits only the analog input current Ix 102 to go to the integrator 101. In this manner, the output 114 of the integrator 101 is compared with the reference value $V_{T2}$ at the respective time points $t_5$ to $t_8$. When the integrator output 114 is larger than the reference value $V_{T2}$, the analog input current Ix and the reference $-I_R$ current are integrated over the period till the next time point. When it is smaller than the voltage $V_{T2}$, only the analog input current Ix is integrated over such a period. At time point $t_8$, the digital control unit 120 issues a switch control signal S11' and stops the signal S12'. Accordingly, from time point $t_8$, the integrator 101 continues its integration operation with an input only of the reference current $-I_R$ (the integrating operation at this time is an inverse integration).

Figure 1:
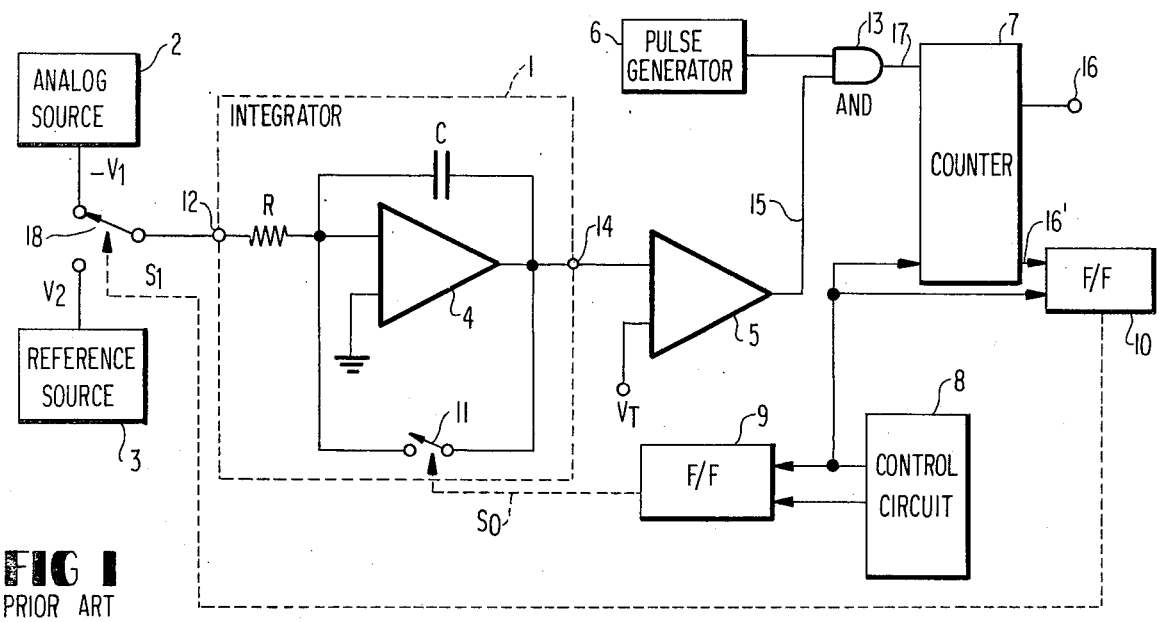
FIG. 1 shows a block diagram of a conventional integrating analog-to-digital converter.
Figure 2:
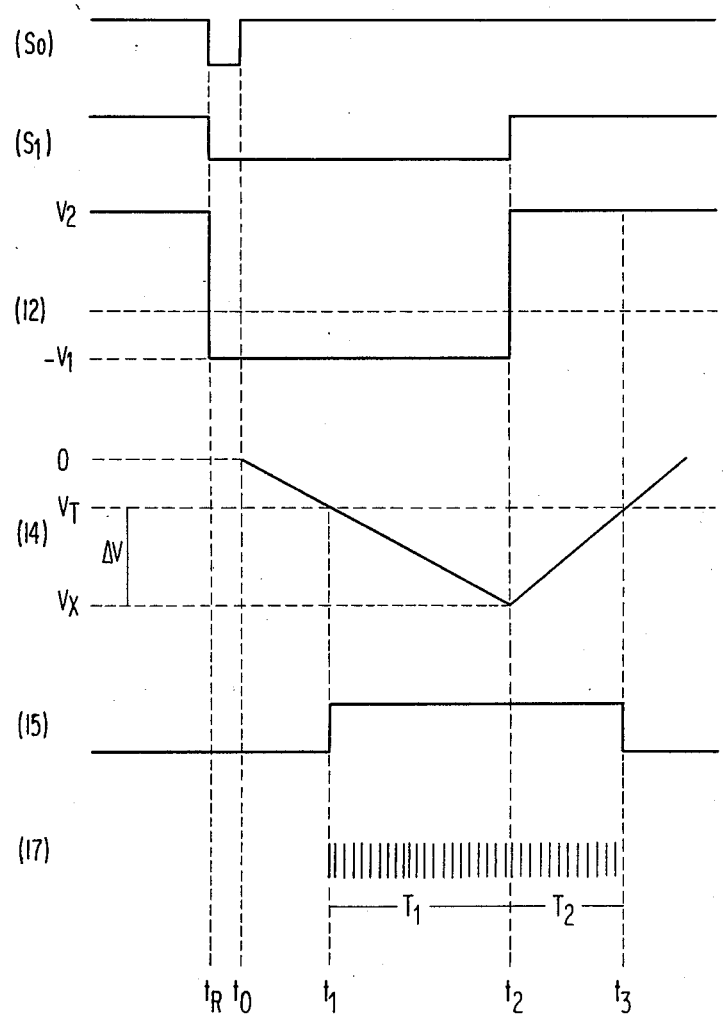
FIG. 2 shows a set of waveforms useful in explaining the operation of the conventional integrating analog-to-digital converter in FIG. 1.

As the inverse integration proceeds, the output 114 of the integrator gradually decreases until it reaches the initial value $V_{T1}$ (the time point at this time is denoted as $t_x$ and the period from time point $t_8$ to time point $t_x$ denoted as $T_x$), the comparator 105 produces an output 105' to the digital control unit 120 so that the digital control unit 120 completes its operation. The total sum of the periods during which the reference current $-I_R$ is applied to the input 112 of the integrator 101, i.e., $T_3+T_4+T_6+T_7+T_8+T_x$, is made to correspond to the analog input current $I_x$. The analog input current Ix can be expressed in digital form by using the number of clock pulses during the sum of the periods. For the purpose of comparison, FIG. 4 also depicts the converting operation of the conventional A-D converter shown in FIG. 1. The waveform 14' indicates an output waveform of an integrator in the conventional A-D converter. During the first period $T_o$, only the analog input current Ix is integrated and then the period $T_x$ for which the output of the integrator returns to the initial value $V_{T1}$ is produced by only the inverse integration of the reference input current $-I_R$, and the period $T_x$ is made to correspond to the analog input current value. On the other hand, in the present invention, the reference current is superposed to the analog input current during the first period $T_o$. Therefore, the value of the integrator output 114 is considerably smaller than that of the conventional converter during the first period $T_o$. Consequently, the time period $T_x$ for which only the reference voltage is applied to the integrator, is considerably shorter than that of the conventional one.

Therefore, the integrating A-D converter according to the present invention can readily be constructed in a monolithic integrated circuit and can be operated at a low voltage. Therefore, an A-D converter with a high precision can be constructed in the monolithic integrated circuit.

An embodiment of the A-D converter according to the invention will be described with reference to FIGS. 5 and 6.

An integrator 31 includes an operational amplifier 34, an integrating capacitor C connected between the input and output of the operational amplifier and voltage to current converting resistors R1 and R2 of which one end of each are connected to the input of the amplifier 34. The other ends a and b of the resistors R1 and R2 are coupled to analog input signal source 32 and a reference power source 33, through switches S11 and S12, respectively. The output 44 of the integrator 31 is coupled to a first comparator (CMP1) 45 receiving an initial value (first bias potential) $V_{T1}$ as a reference input signal and is coupled to a second comparator (CMP 2) 46 receiving a given value (second bias potential) $V_{T2}$ as a reference input signal. The output 45' of the first comparator is supplied to one of the input terminals of an AND gate 47. The output 46' of the second comparator is supplied to one of the input terminals of respective AND gates 53 and 57. A start circuit 38 delivers a start signal 50 to the switch S13 to close it so that the output of the integrator 31 is set at an initial value. The start signal 50 is also supplied to first to third counters (CNT1 to CNT3) 42, 48 and 43 to clear the contents of these counters. An inverted signal of the start signal 50 is supplied to the set (S) input of a first flip-flop (F/F1) 39. The output 39' of the first flip-flop 39 is supplied to the switch S11 to close it and to the AND 47 and, together with a pulse output from a clock pulse generator 36, is supplied to an AND gate 41. The output of the AND gate 41 is supplied to the first counter (CNT 1) 42. The first counter 42, then counts a given number (N) of clock pulses and produces a full scale count pulse 51. The output 51 of the first counter 42 is supplied as a count input to the second counter (CNT 2) 48 and to one of the input terminals of respective AND gates 53 and 57. The second counter 48, when counting a given number (K) of the full scale count pulses 51 from the first counter 42, produces an output 49. The output 49 is supplied to the reset input (R) of a flip-flop 39 and to an OR gate 56 receiving at the other input terminal the output of an AND gate 57. The output of the OR gate 56 is supplied to the set input (S) of a second flip-flop (F/F2) 40. The output 40' of the flip-flop 40 is used to turn the switch S12 on and is supplied as an input signal to a dual input AND gate 52 receiving at the other input terminal the clock pulse from the clock pulse generator 36. The AND gate 52 provides a path for a count input to the third counter (CNT 3) 43. The third counter 43 counts the clock pulses from the clock pulse generator 36 during the time switch S12 is closed. The count contents of the third counter 43 are utilized as a digital output 46. To the reset input (R) of the second flip-flop 40 is supplied an output of an OR gate 54 receiving at its input terminals the outputs of the AND gate 47 and the AND gate 53. The A-D converter thus constructed performs an analog-to-digital conversion under the control as mentioned below.

Firstly, a start pulse is applied to the terminal 38' of the start circuit 38. Upon the application of the start pulse, the start circuit 38 produces the output 50 which controls the switch S13, to close it, thereby setting the output 44 of the integrator 31 at the first bias potential $V_{T1}$ as an initial value and which clears the count contents of the respective counters 42, 43 and 48. Then, the output signal 50 disappears at time point $t_o$ so that the switch S13 is opened and the first flip-flop 39 is set. The output 39' of the flip-flop 39 produced at this time closes the switch S11 thereby coupling the analog input signal source 32 to the input a of the integrator 31 and opens the AND gate 41 to initiate the counting of clock pulses by the first counter 42 simultaneously. Following this, the first counter 42 counts N clock pulses. At this time, i.e. time point $t_1$, the first counter produces a full scale count pulse 51. Further, at this time, the output 44 of the integrator 31 is below the second bias potential $V_{T2}$ and hence the second comparator 46 does not yet activate the output 46' (low level). Accordingly, the gate 57 is not open and the second flip-flop 40 remains in its reset state. Therefore, only the analog input signal source 32 is continuously supplied to the integrator 31 via the input a till the full scale count pulse 51 is produced at time point $t_2$. At time point $t_2$, the output 44 of the integrator is larger than the second bias potential $V_{T2}$; therefore, the second comparator 46 produces a high level signal at its output. Thus, the gate 57 is open and the full scale count pulse 51 from the first counter 42 is supplied to the second flip-flop 40. The flip-flop 40, upon receipt of the pulse 51, is set to produce the output 40'. The output 40' closes the switch S12 so that the reference signal source 33 is supplied to the input b of the integrator 31. The output 40' also causes the gate 52 to open and hence the clock pulse is supplied to the third counter 43. Under this condition, the integrator 31 continues its integration of the current Ix from the analog input signal source 32 and the current $-I_R$ from the reference power source 33. At time point $t_3$, the output 44 of the integrator still exceeds the second bias potential $V_{T2}$ and hence this state of integration is continued till time point $t_4$. At time point $t_4$, the output 44 of the integrator falls below the second bias potential $V_{T2}$ so that the signal 46' becomes a low level to inhibit AND gate 57 while the AND gate 53 is enabled. Thus, the full scale count pulse 51 passes through the gates 53 and 54 to reach the reset terminal R of the second flip-flop 40. As a result, at time point $t_4$ the output 40' of the second flip-flop 40 becomes a low level so that the switch S12 is opened to stop the application of the reference voltage source 33 to the integrator 31. Accordingly, only the analog signal source 32 is applied to the input a of the integrator 31. Simultaneously, the AND gate 52 is inhibited to stop the application of the clock pulse to the third counter 43. Under this condition, only the analog input power source is applied to the integrator, the integrator 31 executes its integration so that the output 44 of the integrator increases and at time $t_5$ exceeds the second bias potential $V_{T2}$. Therefore, as previously mentioned, from time $t_5$, the current Ix from the analog input source 32 and the current $-I_R$ from the reference signal source 33 are applied to the integrator through the inputs a and b, while the clock pulse is applied to the third counter 43. Similarly, at respective time points $t_6$ and $t_7$, the second comparator (CMP 2) 46 compares the output 44 of the integrator 31 with the second bias potential $V_{T2}$. As a result of the comparison, when the integrator output 44 is larger than the second bias potential $V_{T2}$, the sum of the currents Ix and $-I_R$ are integrated by the integrator 31 till the next time point. On the other hand, when the output 44 is smaller than the $V_{T2}$, only the analog input current Ix is integrated by the integrator 31 till the next time point. In this example, at time points $t_6$ and $t_7$, the output 44 of the integrator 31 is above the second bias potential $V_{T2}$ so that the integration condition from the time point $t_5$ is continued till time point $t_8$ and the third counter 43 continues to count the clock pulses. Then, at time point $t_8$ the 8th full scale count pulse 51 from the first counter 42 drives the second counter 48 to produce an output 49, since K=8 in this example. The output 49 resets the first flip-flop 39 to open the switch S11 and to inhibit the AND gate 41 and further sets the second flip-flop 40 through the AND gate 56 to close the switch S12 by the output 40'. Accordingly, from time point $t_8$, the integrator 31 integrates only the reference current $-I_R$. As the integration proceeds, the level of the output 44 of the integrator falls below the first bias potential $V_{T1}$ wherein the time point when the level of the output 44 returns to the $V_{T1}$ is defined as $t_x$. At this time $t_x$, the output 45' of the first comparator 45 becomes low in level so that the output of AND gate 47 resets the second flip-flop 40 thereby to open the switch S12 while at the same time producing a conversion completion signal 61. During the period ($t_o$ to $t_k$) for which the analog input current Ix is supplied to the integrator 31, even if the output of the first comparator 45 becomes low in level, the AND gate 47 is inhibited by the output of flip-flop 39 and therefore does not generate the conversion completion signal 61. As described, hereinafter, this contributes to stabilization of the A-D converting operation when the integrator operates as indicated by a waveform $4a''$ in FIG. 8. In the above operation, the sum of counts counted by the third counter 43 during the period from $t_o$ to $t_x$, that is to say, the total sum of the clock pulses during the periods $T_3$, $T_4$, $T_6$, $T_7$, $T_8$ and $T_x$, is taken as a digital output signal corresponding to the value of the analog signal source 32.

In the above-described embodiment, the same reference current $-I_R$ as that used during the periods $T_3$, $T_4$, $T_6$, $T_7$ and $T_8$ is used for the integration over the period $T_x$. However, another value, e.g. $-2I_R$, may be used for the reference current during the period $T_x$ and the number of clock pulses during the period $T_x$ may be multiplied by a constant, for example 2. In this case, the period of $T_x$ may be further reduced.

The operation of the A-D converter according to the invention will be described with reference to FIG. 7. In this description, $K=2$, that is to say, two periods ($T_1$ and $T_2$) are included in a fixed time period (Tc).

Figure 7:
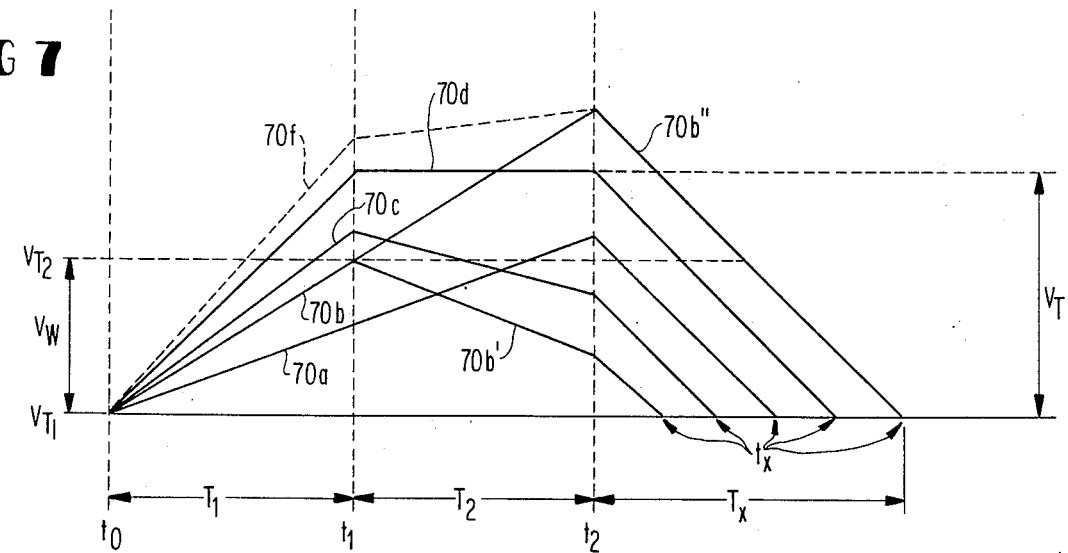
FIG. 7 shows a set of waveforms of the output signal of an integrator used i the converter in the case of K=2.

In FIG. 7, a waveform 70a is a waveform of an integrated output of an integrator when it integrates a relatively small analog input signal. A waveform 70b is the integrator output signal when the output of the integrator is coincident with the fixed bias potential $V_{T2}$ at time point $t_1$ at the end of the time interval $T_1$. The integrator output waveform 70c is obtained when an analog input is signal slightly larger than the analog input signal corresponding to the waveform 70b is applied to the integrator. The integrator output waveform 70d is obtained when a large input analog signal is applied to the integrator.

For the purpose of simplification, an explanation will be given with an assumption that the waveform 70d corresponds to the full scale input analog signal Ix max and that an absolute value of the reference current $-I_R$ is equal to that of the full scale analog signal Ix max.

As $K=2$, the first counter 42 counts twice to a full count to set up two fixed periods $T_1$ and $T_2$. During the period $T_1$, the integrator 31 integrates only the analog input current Ix. During the period $T_2$, in accordance with the output signal from the first comparator 45 at time point $t_1$, the integrator 31 integrates only the analog input current Ix or the reference current $-I_R$ in addition to the analog input current Ix. During the period Tx from time point $t_2$ to time point $t_x$, the integrator 31 integrates only the reference current $-I_R$.

Assume now that:

$$T_1=T_2=T_c=N/f_o=\text{constant},$$

where N is the number of clock pulses and $f_o$ is the frequency of the clock pulse.

Through the integration of the analog input current Ix during the period $2T_c=(T_1+T_2)$ and the integration of the current $-I_R$ only during the time period Tx or the period $(T_x+T_2)$, the integrator returns to the initial value. Accordingly, if $T_R=T_x+T_2\cdot L$ is introduced, where L is 0 or 1, the following equation (2) is obtained:

$$2T_c\cdot I_x+T_R\cdot(-I_R)=0, \qquad (2)$$

where $T_R$ is the period corresponding to the total sum of the periods during which the reference current is applied and $T_R$ is equal to $T_x$ or the sum of $T_x+T_2$. From the above equation (2), we have:

$$I_x=(T_R/2T_c)\cdot I_R. \qquad (3)$$

With designation of $N_R$ for the count of the third counter 43 during the period $T_R$, the analog input current Ix is given as:

$$I_x=N_R/2N\cdot I_R. \qquad (4)$$

This equation (4) represents the conversion principle in the case of $K=2$.

When the analog input signal is relatively small, such as the waveform 70a, that is to say, when the output 44 of the integrator 31 at the end of the period $T_1$ does not reach the fixed bias potential $V_{T2}$, the A-D converter according to the invention operates as in the conventional dual integration type converter, and the count $N_x$ of the third counter 43 during the period $T_x$ has a relationship of $N_R=N_x$ with the given count N of the first counter 42.

On the other hand, when the analog input current is large as shown by the waveforms 70c and 70d and the output 44 of the integrator 31 reaches the bias potential $V_{T2}$ at the end of the period $T_1$, the output of the integrator 31 is likely to be large and the converting time also is likely to be longer. It is for this reason that, in this invention, the analog input current and the reference current are simultaneously integrated thereby to restrict the expansion of a dynamic range of the integrator output and the increase of the converting time. In this case, $N_R=N+N_x$ is gained and hence the converting time is shorter by the time interval taken for counting of N, compared to the conventional type converter.

The following explanation is a limit in the operation of the A-D converter according to the invention. A change $\Delta V_{OUT}(t_1)$ of the integrator output till time $t_1$ is given as follows:

$$\Delta V_{OUT}(t_1)=(I_x/C)\cdot T_c.$$

As indicated by the waveform 70b in FIG. 7, the change $\Delta V_{OUT}(t_1)$ is coincident with $(V_{T2}-V_{T1})$, and the analog input current $I_x$ at this time is expressed by $I_{x2}$. In this case, after time $t_1$ the integrator output changes as indicated by either the waveform $70b'$ or the waveform $70b''$. In the drawing, the current $I_{x2}$ is located at the point where the sectional waveform 70b branches into two curves $70b'$ and $70b''$. Let us consider a limit in the operation of the converter when the output 44 of the integrator 31 changes along the curve $70b'$. In this case, a stable operation condition is that the integrator output 44 at the time point $t_2$ where the period $T_2$ terminates resides between the initial value $V_{T1}$ and the bias potential $V_{T2}$, and is given by:

$$I_{x2}\cdot 2T_c+(-I_R)\cdot T_c>0, \qquad (5)$$

where $(I_{x2}\times T_c)/C=V_{T2}-V_{T1}$. With $V_{T2}-V_{T1}=V_w$, equation (5) is rewritten as follows:

$$2\cdot V_w>I_R\cdot T_c/C,$$

and therefore the following equation is obtained:

$$V_w>(I_R/C)\times(t_c/2). \qquad (6)$$

This equation (6) describes the condition for securing a stable operation of the converter in the case of $K=2$. As seen from equation (6), the second bias potential $V_{T2}$ should be set up at a level more than half of the output changes in the integrator when the reference current $-I_R$ is integrated over the fixed period Tc.

On the other hand, when the integrator output changes along the curve 70b'', the output has the maximum change at time point $t_2$. From this integration, the maximum value of the output of the integrator is determined.

The output change $\Delta V_{OUT}(t_2)$ of the integrator till time point $t_x$ is given by following equation (7):

$$V_{OUT}(t_2)=(I_{x2}/C)\cdot(T_1+T_2)=2V_w. \qquad (7)$$

Here, $V_w$ is expressed by following equation (8):

$$V_w=A\times(I_R/C)\cdot T_c/2. \qquad (8)$$

From equations (6) and (8), we have:

$$A>1. \qquad (9)$$

From the equations (7) and (8), the analog input current $I_{x2}$ at the maximum amplitude is determined as follows:

$$(I_{x2}/C)\times 2Tc=A\cdot(I_R/C)\cdot Tc.$$

Therefore, $I_{x2}=(A/2)\cdot IR$ is obtained The maximum amplitude of the integrator output defined by equation (7) also determines the actual current $I_x(max.)$:

$$I_x(max)\cdot 2Tc/C+(-I_R)Tc/C=2V_w=A\cdot(I_R/C)\cdot T_c$$
$$I_x(max)=(1+A)/2\cdot I_R. \qquad (10)$$

The current $I_x$ given by equation (8) indicates the maximum analog input allowed for the permissible output of the integrator. The integrator output at this time changes as indicated by 70f in FIG. 7.

In the case of A=2, even if the current Ix takes any value within the range 0 and $I_x(max)$, the integrator output at time point $t_1$ fails to reach the bias potential $V_{T2}$. Accordingly, the A-D converter operates as the conventional converter of dual slope integration. To avoid this in the case of K=2, the value of the above-mentioned "A" must be within a range.

$$1<A<2, \qquad (11)$$

and particularly when the value of "A" is closer to 1, a great effect can be expected. That is, in case of $(I_R/C)\cdot T_c<2V_w<2(I_R/C)\cdot Tc$, an excellent effect is obtained. In selecting the value of "A", it is preferable to take account of the variation of the integrator output at time point $t_1$ due to a normal mode signal well known in the art and a tolerable margin for the offset and the hysteresis width of the first comparator 33.

Explanation will be made with reference to FIG. 8 illustrating waveforms of the integrator outputs for various analog inputs in the case of K=4.

In the previous explanation, the first comparator 34 is supposed to produce an output when the integrator output 44 is coincident with or above the second bias voltage $V_{T2}$. However, in an actual circuit, when these are coincident with each other, there is a case where no output is produced from the comparator 34. In the following explanation to follow, such a case will be taken into account. The waveform 4a is the waveform of an operation when the analog input is relatively small and the output of the integrator at time point $t_2$ is coincident with the second bias voltage $V_{T2}$. After time point $t_2$, this waveform 4a changes as shown by the waveforms 4a' or 4a'' in accordance with the result of the comparator 34. When the integrator output changes along the curve 4a'', the integrator output at time point $t_3$ becomes negative in polarity. However, at time point $t_4$, the integrator shifts to the integration of only the analog input current and thus the integral output returns to a potential between the potentials $V_{T1}$ and $V_{T2}$. Therefore, the converting operation can be smoothly conducted. The reason for this is that, during the period of the application of the analog input current, the conversion end command is not issued even when the integration output is below $V_{T1}$, because of the operation of the AND gate 47 shown in FIG. 5. On the other hand, in case that the analog input current is further smaller and the integrator output is coincident with or below the potential $V_{T2}$ at time point $t_3$, the waveform of the integrator output changes as illustrated by a broken line 5a. When this waveform 5a changes along wave form 5a'' after time point $t_3$, the integrator output at time point $t_4$ becomes negative in polarity so that the converting operation becomes impossible. This worst condition takes place when the analog input current Ix(S) reaches the $V_w$ after time point $t_{k-1}$ under the condition of K=2. $I_x(S)$ is related as follows:

$$T_c(K-1)\cdot I_x(S)/C=V_w.$$

Therefore, $$I_x(S)=CV_w/Tc(K-1) \qquad (12)$$

is obtained. During the integration period from time point $t_{k-1}$ to time point $t_k$, if a change of the output of the integrator is below the value $V_w$, the converting operation is possible. The conditional equation for this is given by:

$$\{(Ix(S)-I_R)/C\}\cdot Tc<V_w. \qquad (13)$$

Substituting the equations (8) and (12) into the equation (13), we can rearrange equation (13) into the following:

$$A>2(K-1)/K. \qquad (14)$$

This equation (14) is a general equation for a stable operation condition. In the case of K=2, A>1 is obtained and this result is coincident with equation (9). In the case of K=4, A>3/2 is obtained.

The maximum amplitude of the integrator output generally takes place when the reference current $-I_R$ together with the analog input current $I_x$ are applied to the integrator during the period from time point $t_1$ to time point $t_{k-1}$ and only the analog input current is integrated during the period from time point $t_{k-1}$ to time point $t_k$. This maximum amplitude of waveform is indicated by the waveform form 6a in FIG. 8. The analog current $I_x$ (F) which brings about this condition has the following relation at time point $t_3$:

$$\{Ix(F)/C\}\cdot(K-1)\ Tc-(IR/C)\cdot(K-2)\ Tc=V_w.$$

Therefore, $$Ix(F)=(1/K-1)\{A/2+K-2\}I_R$$

is obtained. The maximum amplitude of the integrator output for the analog input current Ix (F) is given as follows:

$$\Delta V_{OUT}(\max) = V_w + \{I_x(F)/C\} \cdot T_c \quad (15)$$

$$= (T_c \cdot I_R/C)\{A/2 + (1/K - 1)(A/2 + K - 2)\}$$

$$= [A/2 \times K/(K - 1) + (K - 2)/(K - 1)] \cdot V_T.$$

Practically, the value of "A" must be selected so as to satisfy the condition of equation (14) and to have a proper margin for the normal mode error or the like. Also at this time, the maximum amplitude $\Delta V_{OUT}(\max)$ is given by equation (15), and in accordance with this value, the dynamic range of the integrator.

A second embodiment of the analog-to-digital converter according to the invention will be described with reference to FIGS. 9(a) and (b).

As described above, in the embodiment shown in FIG. 5, in the case of K=2, a two-bit counter is required as the second counter 48 in order to count two full scale count pulses from the first counter 41 and to produce a full scale count pulse. Further, in the case of K=4, a three-bit counter is necessary and, in the case of K=8, a four-bit counter is necessary. However, in the present embodiment, the number of the clock pulses required for producing the full count pulse in the second counter 48 can be optionally selected. Therefore, the number K of the fixed periods $T_c$ is also properly selected. With such feature, the resolution of the converter can optionally be selected. The circuit construction to realize such a function is shown in FIG. 9(a). The remaining portion of the circuit is the same as that in FIG. 5, and the second counter 48 in FIG. 5 is replaced by the second counter block 48' in FIG. 9(a). The counter 148 in FIG. 9(a) is composed of four stages B1 to B4 corresponding to $2^0, 2^1, 2^2, 2^3$. The value of K, that is, resolution, is set up by using logical inputs $\alpha$ and $\beta$ applied from the exterior. As shown, bit B1, $\alpha$ and $\beta$ are applied as inputs to an AND gate 301 to provide a resolution of K=1. Bit B2, $\alpha$ and inverted $\beta$ are applied as inputs to an AND gate 302 to provide a resolution of K=2. Bit B3, inverted $\alpha$ and $\beta$ are applied as inputs to an AND gate 303 to provide a resolution of K=4. Bit B4, inverted $\alpha$ and inverted $\beta$ are applied as inputs to an AND gate 305 to provide a resolution of K=8. The outputs of these gates are transferred through an OR gate 304 to the line 49. In other words, when the first counter 42 is a binary counter having I (I denotes positive integer) bits, four types of resolutions, i.e. K=1, 2, 4, 8, can be set up by properly combining logical inputs $\alpha$ and $\beta$, as shown in FIG. 9(b). Where various analog systems are processed in time division by using a microprocessor, this function has an advantage in that, for example, the resolution suited for the respective analog controls can be selected at will and further the increase in unnecessary conversion time can be restricted.

In general, with the maximum value of $K=2^{n-1}$, if the counter 148 is composed of n bits and $\log_2 n$ logical terminals for the logical signals applied from the exterior are provided, an arbitrary K selected from numbers $2^{n-1}, 2^{n-2}, \ldots, 1$ can be established.

The third embodiment of the invention will be described with reference to FIGS. 5, 10, 11(a) and 11(b).

In this embodiment, there is described an example of means for removing the unfavorable operation condition for the analog input current corresponding to the wave 5a'' in FIG. 8. When the outputs of the integrator at times $t_1$ and $t_2$ fail to reach the potential $V_{T2}$, the application of the reference current $-I_R$ to the integrator is inhibited irrespective of the result of the comparator 46 in FIG. 5 at time point $t_3$ thereby overcoming the unfavorable operation condition. The operation limit of the converter in this embodiment is determined by equation (9), not by equation (14). An example of the additional circuit for realizing the operation in the case of K=4 is shown in FIG. 10. This is realized by replacing the AND gate 57 in FIG. 5 by a logic unit 57' in FIG. 10.

In the circuit, the second counter 48'' is constructed with three stages B1, B2 and B3 corresponding respectively to counts 1, 2 and 4. The logic unit 57' receives an output St1 of the stage B1 and an output St2 of the stage B2. More particularly, the outputs St1 and St2 are applied to the gate NAND 156 and the AND gates 153 and 154. To the AND gates 153 and 154 are also applied the outputs of the first counter 42, the output 46' of the second comparator 46, and the output of the gate 156. The output S153 of the gate 153 is applied to the set input(S) of the flip-flop 152. The output S154 of the gate 154 is applied to the set input (S) of the flip-flop 151. The outputs of these flip-flops 151 and 152 are applied through an OR gate 170 to an AND gate 171, together with the output 46' of the second comparator and the output 51 of the first counter 42. The output of the gate 171 is connected to the input of the OR gate 56.

In operation, when there is no output of the second comparator 46 (i.e., the output of the second comparator is at low level) in synchronism with the pulse 51 derived from the second counter 48'' at time points $t_1$ and $t_2$, the flip-flop (F/F3) 151 and the flip-flop (F/F4) 152 are both not set inhibiting AND gate 171 and thus the flip-flop 40 is not set by the output of the second comparator 46 at time point $t_3$ so that only the analog input current $I_x$ is applied to the integrator 31.

The above operation will be described with reference to FIG. 11(a). At time points $t_1$ and $t_2$ the first counter 42 produces full count signal 51. The full count signal 51 is counted by the second counter 48'', and the counter 48'' produces from the stages B1 and B2 the signals St1 and St2 at time points $t_1$ and $t_2$, respectively. The NAND gate 156 enables AND gates 154 and 153 at time point $t_3$ when the signals St1 and St2 are produced as outputs. Therefore, AND gates 153 and 154 apply set pulses S153 and S154 to the flip-flops 151 and 152 depending on the outputs of the second comparator 46 at time points $t_1$ and $t_2$ respectively. The truth table at this time is shown in FIG. 11(b). The output Q of the second comparator 46 at time point $t_1$ causes the AND gate 153 to produce an output Q. At time point $t_2$ the output 46' of the second comparator 46 causes the AND gate 154 to produce an output Q' at the output S154. The output S154 of the gate 154 at time point $t_1$, the output S153 of the gate 153 at time point $t_2$, and outputs S154 and 153 of the AND gates 154 and 153 at time point $t_3$ are always kept at a low level irrespective of the output from the comparator 46.

Generally, this embodiment of the present invention is applicable to a case of any value of K other than 4. When the output of the integrator does not reach the second bias potential $V_{T2}$ during the time period from $t_o$ to $t_M$ (where M=K/2 when K is an even number, and M=(K−1) or M=(K+1)/2 when K is an odd number), for example, only the analog input current $I_x$ may be applied to the integrator irrespective of the output of the second comparator 46 during the period from time point $t_M$ to time point $t_k$. In this case, with respect to the bit counting a lower order number than the bit counting M in the second counter 48″, the logical unit 57′ may be constructed in a manner similar to FIG. 10. Alternatively, when the integrator output fails to reach the potential $V_{T2}$ at the respective n time points (n: positive integer) continuously arranged $i-1, i-2, \ldots i-n$ till time point i, only the analog input current Ix may be applied to the integrator irrespective of the output of the second comparator from time point $t_1$ to time point $t_k$. In this case, with respect to bits for counting $i-1$ to $i-n$ in the second counter 48″, the logic unit 57′ may similarly be constructed.

Figure 12:
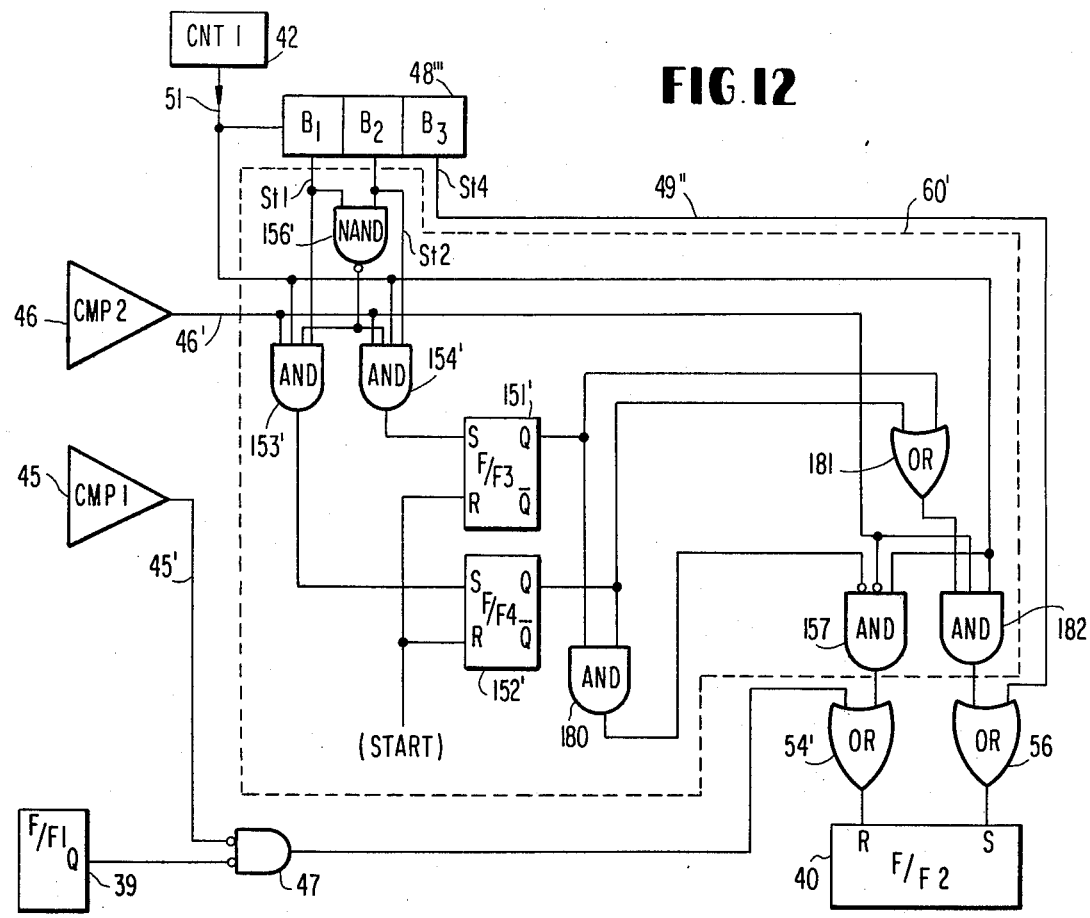
FIG. 12 shows a schematic block diagram of the analog-to-digital converter according to a fourth embodiment of the present invention.

The fourth embodiment of the analog-to-digital converter according to the present invention will be described with reference to FIGS. 5 and 12.

In this embodiment, when the output of the second comparator 46 are at a high level both at time points $t_1$ and $t_2$, for example, as indicated by wave forms 2a or 6a in FIG. 8, the reference current $-I_R$ is continuously applied irrespective of the output of the second comparator 46 at time point $t_3$ so that an unnecessary expansion of the output value of the integrator can be restricted. The circuit for attaining this purpose can be realized by adding some circuits to the circuit shown in FIG. 10, and such an exemplary circuit is illustrated in FIG. 12. This embodiment is constructed by replacing the gate block portion 60 in FIG. 5 by a logic block 60′ in FIG. 12. In the logic block 60′, the second counter 48‴ having stages B1 to B3 with bit outputs St1 to St4 applies outputs St1 and St2 to a NAND gate 156 and to AND gates 153′ and 154′. The output 46′ of the second comparator 46, the output 51 of the first counter 42 and the output of the NAND gate 156′ are also applied to the AND gates 153′ and 154′. The outputs of the AND gates 153′ and 154′ are applied to the set inputs (S) of the flip-flops 152′ and 151′ respectively. The outputs of the flip-flops 152′ and 151′ are applied to an AND gate 180 and AND gate 182 via an OR gate 181. The output of AND gate 180 is applied to an inverted input of AND gate 157. To the inputs of AND gates 157 and 182, the output 46′ of the comparator 46 and the output 51 of the first counter 51 are also applied. The outputs of the AND gates 157 and 182 are coupled to the inputs of the OR gates 54′ and 56 respectively.

In operation, when the second comparator (CMP2) 46 produces outputs of high level at time points $t_1$ and $t_2$, the flip-flops 152′ and 151′ are both set respectively at time point $t_1$ and at this point $t_2$. Under this condition, the reset at time point $t_3$ of the flip-flop (F/F2) 40 is inhibited by the gate 157 and the second flip-flop (F/F2) 40 is reset by only the output signal from the first comparator 45 at time point $t_x$, neglecting the output of the second comparator 46 at time point $t_3$.

The operation limit in this embodiment is based on "A" determined by expression (9) or (11) and the maximum value of the output of the integrator is $2V_w$. This embodiment may be so designed that, by using M or i defined as in the third embodiment, during time points $t_{M-1}$ (or $t_{i-1}$), ... $t_1$ ($t_{i-n}$), when the output 44 of the integrator exceeds the voltage $V_{T2}$, the reference current is superposed on the analog input signal after time point $t_M$ (or $t_1$).

The fifth embodiment of this invention will be described with reference to FIGS. 5 and 13.

Figure 5:
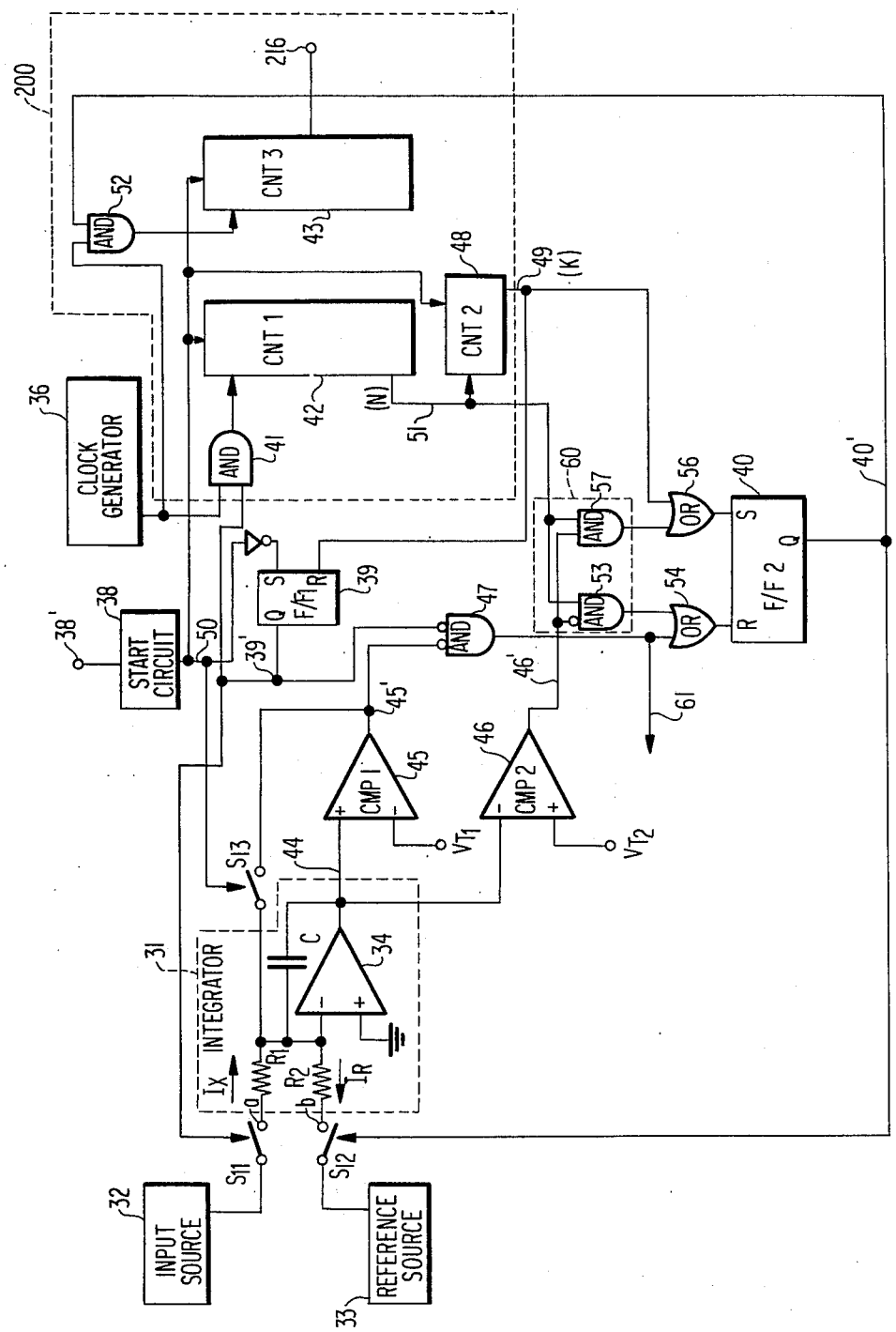
FIG. 5 shows a block schematic diagram of first embodiment of an analog-to-digital converter according to the present invention.
Figure 6:
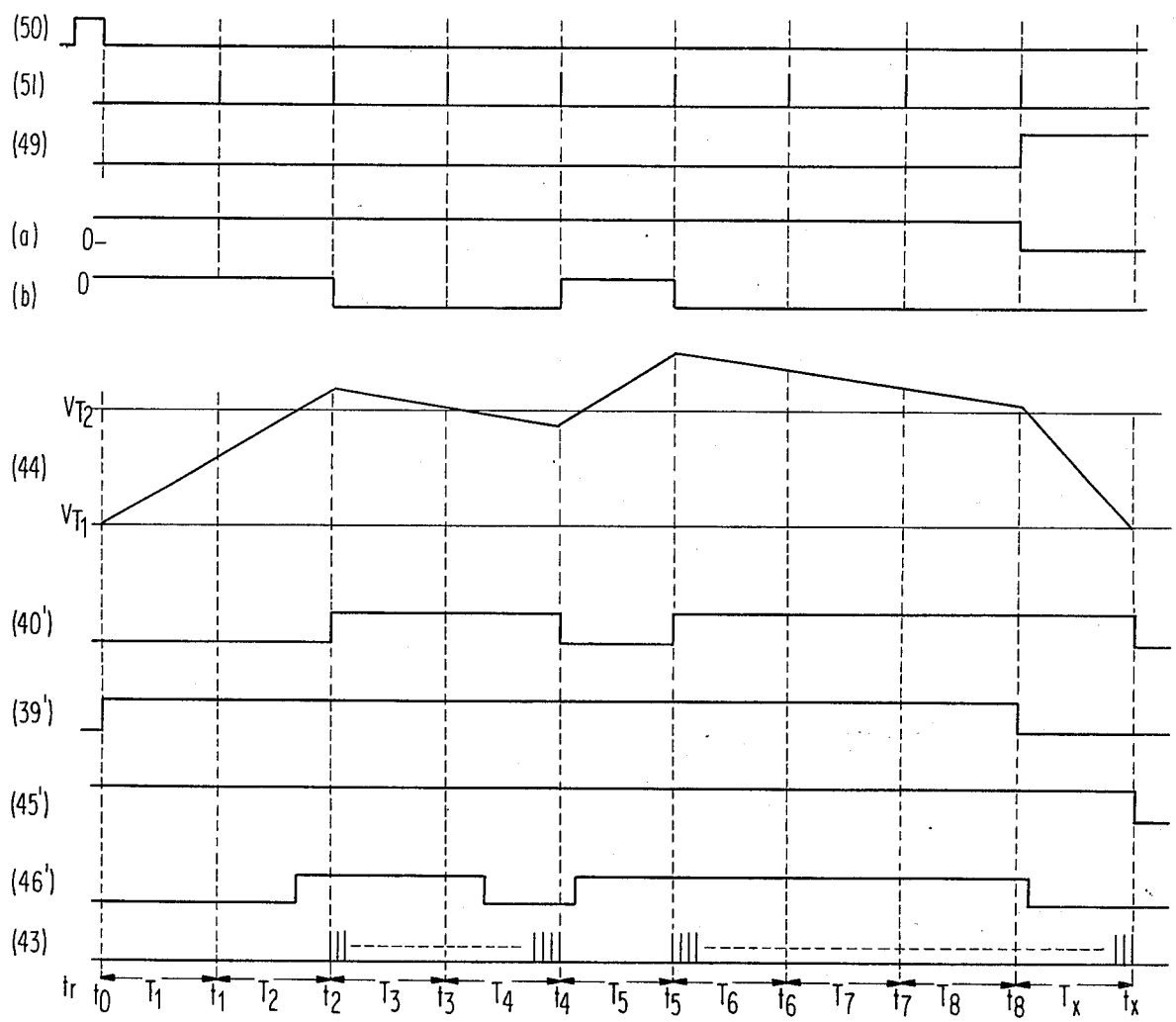
FIG. 6 shows a set of waveforms at the respective points in the analog-to-digital converter according to the present invention, when K=8.

This embodiment is a modification of the count control unit 200 in the first embodiment in FIG. 5.

Figure 13:
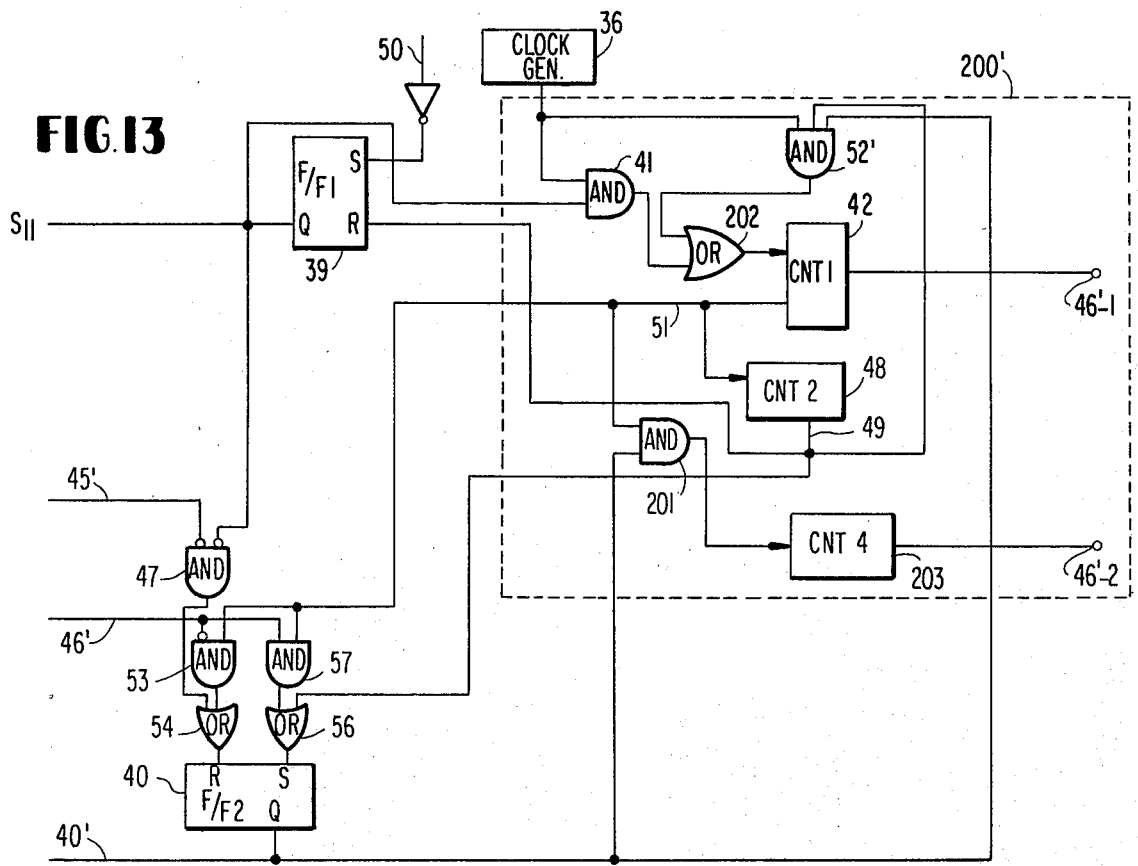
FIG. 13 shows a schematic block diagram of the analog-to-digital converter according to a fifth embodiment of the invention.

The analog-to-digital converter of this embodiment is constructed by replacing the counter controller 200 in FIG. 5 by the count controller 200′ shown in FIG. 13.

In this embodiment, the first counter (CNT1) 42 produces lower bit data 46′-1 of the digital output corresponding to the analog input current; that is to say, it counts the number of clock pulses during the time period $T_x$. The fourth counter (CNT4) 203 produces the upper bit data 46′-2 of the digital output; that is to say, in the K times of fixed periods till time point $t_k$, it counts the total sum of the periods during which the reference current $-I_R$ is applied to the integrator.

In the count control unit 200′ according to the present invention, the fourth counter (CNT4) 203 receives the logical product of the full count pulse 51 of the first counter (CNT1) 42 and the set output of the flip-flop (F/F2) 40 to count the total numbers of the periods during which the reference power source 33 is applied to the input b of the integrator 31 till time point $t_R$ through the closure of the switch S12.

In the count control unit 200′, the result of the counting (the total sum of the periods during which the reference current $-I_R$ is applied to the integrator till time point $t_k$) by the fourth counter 203 is used as the upper bit data output 46′-2 in the digital output. While the set output 40′ for closing the switch S12 of the flip-flop (F/F2) 40, the output 49 of the second counter (CNT2) 48 and the clock pulse generator 36 are logically multiplied by an AND gate 52′. Therefore, the clock pulse during the period Tx is applied to the first counter (CNT1) 42, through the AND gate 52′ and an OR gate 202 so that the counter 42 counts the number of clock pulses during the period $T_x$ as the lower bit data output 46′-1. The digital output corresponding to the analog input current converted in this embodiment is expressed by $n \times N + m$ where N is the number of clock pulses during the fixed period (Tc), and n and m are respectively the upper bit data output 46′-2 and the lower bit data output 46′-1. This is coincident with the total counts in the third counter 43 in the embodiment shown in FIG. 5, provided that the input and operation conditions of the present input are the same as those in FIG. 5. If necessary, proper means may be used to take out the total sum $n \times N + m$ based on the lower and upper bit data outputs 46′-1 and 46′-2.

As described above, the A-D converter according to the present invention is operable at a low voltage and with a short converting time and can properly change the converting resolution. Further, it is suitable for a monolithic integrating circuit. Though the precision for detecting time point $t_x$ by the first comparator depends largely on the gain, the hysteresis width and the offset voltage thereof, the requirement in design for the first comparator is not strict and a large gain of the second comparator is not needed, because a substantially large amplitude is apparently obtained with a low voltage.

It is noted that widely different embodiments and variations of this invention can be made without departing from the spirit and scope of this invention and that this invention is not limited to the specific embodiments described above.

I claim:

1. An analog-to-digital converter comprising:
   means for setting a plurality of successive time intervals,
   an integrator,
   means for setting the output signal of said integrator at a start value at the initiation of said plurality of successive time intervals, means for applying an analog input signal to said integrator for said plurality of successive time intervals, a source of a reference signal of opposite polarity to that of said analog input signal, means for detecting that the output level of said integrator exceeds a predetermined value at a time point when each of said time intervals terminates, said predetermined value having the same polarity as that of said analog input signal and being larger than said start value in absolute value, means responsive to said detecting means for supplying said reference signal to said integrator in superposition on said analog input signal during the succeeding time interval, means for applying only said reference signal to said integrator after said plurality of time intervals, means for detecting the time point when the output level of said integrator returns to said start value, and means for accumulating a digital count proportional to the total duration of the time when said reference signal is applied to said integrator.

2. An analog-to-digital converter comprising:

an integrator, means for applying an analog input signal over a first period to said integrator, means for setting the output level of said integrator at a start value at the initiation of said first period, a source of a reference signal of opposite polarity to that of said analog input signal, means for judging two or more times within said first period whether the output of said integrator is above or below a predetermined value, said predetermined value having the same polarity as that of said analog input signal and being larger than said start value in absolute value, means for selectively superposing said reference signal on said analog signal inputted to said integrator within said first period when the output level of said integrator is above said predetermined value in absolute value, means for supplying only said reference signal to said integrator after said first period, means for detecting the time point when the output level of said integrator returns to said start value, and means for accumulating a digital count proportional to the total duration of the time when said reference signal is applied to said integrator.

3. An analog-to-digital converter comprising:

an integrator, means for applying an analog signal to said integrator over a first period, a source of a first reference signal of opposite polarity to that of said analog signal, a source of a second reference signal of opposite polarity to that of said analog signal, means for setting the output level of said integrator at a start value at the initiation of said first period, means for establishing a polarity of time points within said first period, means for judging whether the output level of said integrator is above or below a predetermined value at each of said time points, said predetermined value having the same polarity as that of said analog signal and being larger than said start value in absolute value, means responsive to said judging means for selectively superposing said first reference signal on said analog signal within said first period, means for applying only said second reference signal to said integrator during a second period after said first period until the output level of said integrator reaches said start value, means for detecting a third period during which said first reference signal is superposed on said analog signal, and means for converting said second and third periods into a digital signal corresponding to the value of said analog signal.

4. An analog-to-digital converter as claimed in claim 3, further comprising:

means for setting time points of K (K is an integer of 2 or more) during said first period, and means for comparing said integrated value with a given value at each of said time points, wherein the superposition of said second reference power source is made in accordance with the results of comparison.

5. An analog-to-digital converter as claimed in claim 3, further comprising: means for setting time points of K (K is an integer of 2 or more) during said first period, means for detecting that the integrated value does not reach a given value from (M−n)th time point (M is an integer smaller than K and n is an integer below M) to (M−1)th time point in K time points, and means responsive to the last-mentioned detecting means for inhibiting the superposition of said reference power source after M-th time point.

6. An analog-to-digital converter as claimed in claim 3, further comprising:

means for setting K numbers of time points (K is an integer of 2 or more) during said first period, means for detecting that the integrated value exceeds a given value continuously from (M−n) the time point (M is an integer smaller than K and n is an integer below M) to (M−1)th time point M−1, and means responsive to the last-mentioned detecting means for enforcing superposition of the second reference power source after M0th time point.

7. An analog-to-digital converter as claimed in claims 4, 5 or 6, in which said K is selectively variable.

8. An analog-to-digital converter as claimed in any of claims 3, 4, 5 or 6, in which said first reference power source is the same as said second reference power source.

9. An analog-to-digital converter as claimed in claim 1 wherein said means for setting a predetermined number of successive time intervals comprises:

clock generator means for generating clock pulses at a predetermined frequency, first counter means for counting said clock pulses to establish the duration of each of said time intervals, and second counter means connected to an output of said first counter means for counting said predetermined number of successive time intervals.

10. An analog-to-digital converter as claimed in claim 9, wherein said means for accumulating a digital count comprises third counter means for counting said clock pulses during those time intervals when said reference signal is supplied to said integrator.

11. An analog-to-digital converter as claimed in claim 9 wherein said means for accumulating a digital count includes said first counter means which accumulates a count providing the least significant bits of a digital signal corresponding to the value of said analog signal, said means for accumulating further comprising fourth counter means connected to an output of said first counter means for accumulating a count providing the most significant bits of said digital signal.

12. An analog-to-digital converter comprising:
an integrator,
means for initially setting the output of said integrator to a first predetermined value,
clock generator means for generating clock pulses having a predetermined frequency,
first counter means for counting said clock pulses to establish a time interval,
second counter means connected to an output of said first counter means for counting a plurality of time intervals,
means for applying an analog input signal to said integrator for said plurality of successive time intervals,
a source of a reference signal of opposite polarity to that of said analog input signal,
means for detecting that the output level of said integrator exceeds a second predetermined value at a time point when each of each time intervals terminates, said second predetermined value having the same polarity as that of said analog input signal and being larger than said first predetermined value in absolute value,
means responsive to said detecting means for supplying said reference signal to said integrator in superposition on said analog input signal during the succeeding time interval, means for applying only said reference signal to said integrator after said plurality of time intervals,
means for detecting when the output level of said integrator returns to said first predetermined value, and
means for accumulating a digital count proportional to the total number of periods when said reference signal is applied to said integrator.

13. An analog-to-digital converter as claimed in claim 12 wherein said means for accumulating a digital count comprises third counter means for counting said clock pulses during those time intervals when said reference signal is supplied to said integrator, said third counter means providing a digital output signal corresponding to the value of said analog signal.

14. An analog-to-digital converter as claimed in claim 12 wherein said means for accumulating a digital count includes said first counter means which provides the least significant bits of a digital signal corresponding to the value of said analog signal, said means for accumulating further comprising fourth counter means connected to an output of said first counter means for providing the most significant bits of said digital signal.

15. An analog-to-digital converter comprising:
an integrator,
a first switch for selectively supplying an analog signal to the input of said integrator,
a source of a reference signal of opposite polarity,
a source of a first predetermined level,
a source of a second predetermined level, said second predetermined level being of the same polarity as that of said analog signal and larger than said first predetermined level in absolute value,
a first comparator having a first input coupled to the output of said integrator and a second input supplied with said first predetermined level,
a second comparator having a first input coupled to the output of said integrator and a second input supplied with said second predetermined level,
a second switch for selectively supplying said reference signal to the input of said integrator,
a first counter having an input and means for supplying said input of said first counter with the output of said clock signal generator, and
a second counter having an input and means for supplying said input of said second counter with the output of said first counter, said second counter counting a plurality of changes in the output of said first counter thereby to produce a full count signal, first control means responsive to the output of said first counter for selectively enabling said second switch thereby to superpose said reference signal on said analog signal in response to the output of said second comparator, second control means responsive to said full count signal for disenabling said first switch, and third control means responsive to the output of said first comparator for disenabling said second switch.

16. An analog-to-digital converter comprising:
interval means for operatively setting a predetermined plural number of successive time intervals,
an integrator,
means for setting the output of said integrator at an initial value in response to a start command signal,
first means for operatively applying an analog input signal to said integrator,
a source of a first reference signal of opposite polarity to that of said analog input signal,
a source of a second reference signal of opposite polarity to that of said analog input signal,
a first comparator coupled to the output of said integrator for comparing the output of said integrator with a first value,
a second comparator coupled to the output of said integrator for comparing the output of said integrator with a second value larger than said first value, said first comparator producing a first signal when the output of said integrator is above said first value in absolute value, said second comparator producing a second signal when the output of said integrator is above said second value in absolute value,
first control means responsive to said start command signal for controlling said first means so as to apply said analog input signal to said integrator,
second control means responsive to said first signal for enabling said interval means to start said predetermined plural number of successive time intervals,
third control means responsive to said second signal at the termination of said time interval for superposing said first reference signal on said analog input signal inputted to said integrator for the next time interval,
second means for applying said second reference signal to said integrator after the termination of said predetermined plural number of successive time intervals,
fourth control means responsive to the termination of said predetermined plural number of successive time intervals for inhibiting said first means from applying said analog input signal to said integrator, means responsive to said first signal after the termination of said predetermined plural number of successive time intervals for inhibiting said second means from applying said second reference signal to said integrator, means for detecting a first period during which said first reference signal is superposed on said analog input signal, and means for detecting a second period during which said second reference signal is anppied to said integrator.

* * * * *

UNITED STATES PATENT AND TRADEMARK OFFICE
CERTIFICATE OF CORRECTION

PATENT NO. : 4,268,820

DATED : May 19, 1981

INVENTOR(S) : Kyuichi HAREYAMA

It is certified that error appears in the above—identified patent and that said Letters Patent is hereby corrected as shown below:

Column 1, line 49, delete "$t_{11}$" and insert -- $t_1$ -- .

Column 2, line 38, delete "PS" ;

line 53, delete "s" and insert -- is -- ;

line 61, delete "have" .

Column 3, line 8, delete "selectivwely" and insert -- selectively -- ;

line 49, delete "$t_1$" (second occurrence) and insert -- $t_2$ -- .

Column 4, line 32, delete "inut" and insert -- input -- ;

line 44, delete "$=I_R$" and insert -- $-I_R$ -- .

Column 6, line 2, delete "$V_{T2}$ L" and insert -- $V_{T2}$ -- ;

line 40, delete "i" and insert -- in -- .

Column 9, line 7, after "AND" insert -- gate -- .

Column 14, line 38,

Column 16, line 63, delete "M=(K-1)" and insert -- M=(K-1)/2 -- .

Column 20, line 44, delete "M0th" and insert -- M-th -- ;

UNITED STATES PATENT AND TRADEMARK OFFICE
CERTIFICATE OF CORRECTION

PATENT NO. : 4,268,820
DATED : May 19, 1981
INVENTOR(S) : Kyuichi HAREYAMA

It is certified that error appears in the above—identified patent and that said Letters Patent is hereby corrected as shown below:

Column 20, lines 52-53, delete "predetermined number" and insert -- plurality -- .

Column 21, line 27, delete "each time intervals" and insert -- said time intervals -- .

Column 22, between lines 8 and 9, insert -- a clock generator --.

Signed and Sealed this

Fifteenth Day of September 1981

[SEAL]

Attest:

Attesting Officer

GERALD J. MOSSINGHOFF
Commissioner of Patents and Trademarks